United States Patent
Lips

(10) Patent No.: US 10,094,895 B2
(45) Date of Patent: Oct. 9, 2018

(54) TRANSMIT/RECEIVE SWITCHING CIRCUITRY WITH IMPROVED RADIO FREQUENCY ISOLATION

(71) Applicant: KONINKLIJKE PHILIPS N.V., Eindhoven (NL)

(72) Inventor: Oliver Lips, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 815 days.

(21) Appl. No.: 14/440,092

(22) PCT Filed: Oct. 23, 2013

(86) PCT No.: PCT/IB2013/059569
§ 371 (c)(1),
(2) Date: May 1, 2015

(87) PCT Pub. No.: WO2014/068448
PCT Pub. Date: May 8, 2014

(65) Prior Publication Data
US 2015/0293189 A1    Oct. 15, 2015

Related U.S. Application Data

(60) Provisional application No. 61/722,288, filed on Nov. 5, 2012.

(51) Int. Cl.
*G01R 33/36* (2006.01)
*G01R 33/54* (2006.01)
*H04B 1/44* (2006.01)

(52) U.S. Cl.
CPC ....... *G01R 33/3664* (2013.01); *G01R 33/543* (2013.01); *H04B 1/44* (2013.01)

(58) Field of Classification Search
CPC ..... G01R 33/3664; G01R 33/543; H04B 1/44
See application file for complete search history.

(56) References Cited

U.S. PATENT DOCUMENTS 6,198,288 B1    3/2001    Gauss et al.
6,633,161 B1 *  10/2003   Vaughan, Jr. .... G01R 33/34046
                                                      324/318

(Continued)

FOREIGN PATENT DOCUMENTS

| EP | 1004886 A2 | 5/2000 |
| JP | 595930 A | 4/1993 |
| JP | 2011130835 A | 7/2011 |

OTHER PUBLICATIONS

The Pin Diode Circuit Designers Handbook, 1998, #98=WPD-RDJ007, Fig. 2.11.

*Primary Examiner* — Dixomara Vargas

(57) ABSTRACT

A transmit/receive switching circuitry (40; 48) for a magnetic resonance radio frequency antenna (M) for use in an magnetic resonance imaging system (10), the transmit/receive switching circuitry comprising: -a radio frequency input transmission line (TX) provided for transmitting radio frequency power to the magnetic resonance radio frequency antenna (M) and a radio frequency output transmission line (RX) provided for transferring away magnetic resonance signals received by the magnetic resonance radio frequency antenna (M) at a magnetic resonance frequency from the magnetic resonance radio frequency antenna (M);—a parallel resonant circuit (42) with a resonance frequency that is substantially equal to the magnetic resonance frequency, and that is connected in parallel to the magnetic resonance radio frequency antenna (M) with regard to the radio frequency input transmission line (TX),—a series resonant circuit (44) with a resonance frequency that is substantially equal to the magnetic resonance frequency, and that is connected in series between the radio frequency input transmission line (TX) and the radio frequency output transmission line (RX); for providing improved radio frequency isolation between the radio frequency input transmission line (TX) and the radio (Continued)

frequency output transmission line (RX); a method for generating consecutive RF transmit periods and RF receive periods of the magnetic resonance imaging system (10) using such a transmit/receive switching circuitry (40; 48); a switching control unit (32) having at least one such transmit/receive switching circuitry (40; 48), for use in the magnetic resonance imaging system (10); a software module (26) for controlling an execution of such a method.

10 Claims, 5 Drawing Sheets

(56) References Cited

U.S. PATENT DOCUMENTS

| | | | |
|---|---|---|---|
| 6,747,452 B1 | 6/2004 | Jectic | |
| 7,202,734 B1 * | 4/2007 | Raab | H03F 3/04 330/126 |
| 7,268,554 B2 * | 9/2007 | Vaughan | G01R 33/34046 324/318 |
| 7,538,554 B2 | 5/2009 | Wendt | |
| 7,962,224 B1 * | 6/2011 | Blischak | A61N 1/0553 607/1 |
| 7,986,143 B2 * | 7/2011 | Walsh | A61B 5/055 324/309 |
| 8,013,609 B2 | 9/2011 | Vartiovaara | |
| 8,451,004 B2 * | 5/2013 | Walsh | A61B 5/055 324/309 |
| 8,643,326 B2 * | 2/2014 | Campanella | H01Q 7/00 320/108 |
| 9,013,069 B2 * | 4/2015 | Yamamoto | H02J 17/00 307/104 |
| 9,124,122 B2 * | 9/2015 | Kim | H02J 5/005 |
| 9,509,173 B2 * | 11/2016 | Kim | H02J 5/005 |
| 9,869,735 B2 * | 1/2018 | Leussler | G01R 33/4215 |
| 9,923,381 B2 * | 3/2018 | Walley | H02J 5/005 |
| 2012/0098542 A1 | 4/2012 | Van Helvoort | |

* cited by examiner

TRANSMIT/RECEIVE SWITCHING CIRCUITRY WITH IMPROVED RADIO FREQUENCY ISOLATION

CROSS-REFERENCE TO PRIOR APPLICATIONS

This application is the U.S. National Phase application under 35 U.S.C. § 371 of International Application No.PCT/IB2013/059569, filed on Oct. 23, 2013, which claims the benefit of U.S. Provisional Patent Application No. 61/722,288, filed on Nov. 5, 2012. These applications are hereby incorporated by reference herein.

FIELD OF THE INVENTION

The invention pertains to a transmit/receive (T/R) switching circuitry for a magnetic resonance (MR) radio frequency (RF) antenna for use in an MR imaging system.

BACKGROUND OF THE INVENTION

In the field of magnetic resonance (MR) imaging, it is known to employ MR radio frequency (RF) antennae that are provided for transmitting RF power at a resonance frequency for resonant excitation of nuclei in a subject of interest during a first period of operation, and for receiving MR RF energy emitted by the nuclei at a second period of operation that is different from the first period of operation.

In the state of the art of operating an MR imaging system, periods of transmitting RF power and periods of receiving magnetic resonance imaging signals are taking place in a consecutive manner during an MR imaging session. The periods of transmitting RF power and periods of receiving MR imaging signals may be generated by controlling the MR antenna by transmit/receive (T/R) switches.

T/R switches of the prior art may apply PIN (positive intrinsic negative) diodes as switching elements. Typically, a low RF impedance, which is formed by a forward-biased PIN diode, is transformed via a quarter-wave transmission line into a high RF impedance as its dual at a corresponding connection point. T/R switches of this type are, for instance, described in FIG. 2.11 of Microsemi-Watertown: *"The Pin Diode Circuit Designers' Handbook"*, 1998, DOC. #98=WPD-RDJ007, Microsemi Corporation, 580 Pleasnt Street, Watertown, Mass. 02472, USA. In order to achieve sufficient RF isolation between an RF amplifier providing RF power for resonant excitation and a preamplifier at a receiving end during a period of receiving MR imaging signals, the quarter-wave transformation has to be repeated in several stages. In most cases, two stages provide sufficient RF isolation.

Since the transmission lines required for the quarter-wave transformation tend to be very long and bulky, they can be replaced by corresponding networks exhibiting the same transformation properties. As a consequence, each component of this network is given.

A typical embodiment of a prior art T/R switch is shown in FIG. 1a. FIG. 1b illustrates an equivalent lumped-element circuit employing a π-network, wherein required inductor L and capacitors C are individually exactly determined. In FIG. 1a, an RF input line TX' is providing RF power for the resonant excitation of nuclei from an RF amplifier (not shown). The RF input line TX' is connected to an MR RF antenna M' via a PIN diode D, which in turn is connected to a quarter-wave RF transmission line ($\lambda$/4). A distal end of the quarter-wave RF transmission line is connected both to a receiving port RX' with an RF pre-amplifier provided to amplify received MR signals, and to another PIN diode D'. The PIN diodes can be transferred between a state of low RF impedance and a state of high RF impedance by controlling a DC bias current, whose providing circuitry is not shown for clarity reasons.

As can be gathered form FIG. 1b, the RF isolation per stage of the receiving port RX' during periods of transmitting RF power is mainly given by a voltage divider formed by an inductance L and a low RF impedance of diode D'. Since both values are fixed in principle by the π-network equivalent to the quarter-wave transmission line ($\lambda$/4), the RF isolation per stage is also determined.

Typically, one stage allows for an RF isolation during periods of transmitting RF power of about 40 dB. If an RF power level of e.g. 62 dBm (approx. 1.6 kW) is applied to the receiving (RX') port, there is not enough safety margin to reliably protect the RF pre-amplifier (only 62 dBm−40 dB=22 dBm at a maximum allowable power level of about 25 dBm). For this reason, a second stage ST' has to be added, which increases complexity and physical size of the T/R switch. Additionally, a higher total bias current has to be provided.

For reasons shown, present T/R switches typically consist of two stages in order to achieve the required isolation. An example of a prior art two-stage T/R switch and its equivalent lumped-element circuit is shown in FIGS. 1c and 1d, respectively. They comprise a large number of elements or bulky transmission lines requiring a high total DC bias current.

With an increasing interest in local multi-element MR RF antenna arrays provided as well for transmitting RF power for resonant excitation as for receiving MR imaging signals, there is a growing need for improved transmit/receive switches. For these, it is desirable to provide improved RF isolation both during the periods of transmitting RF power and during periods of receiving MR imaging signals. Other objectives are to provide more design freedom for T/R switches and to lower the total required DC bias current in relation to the RF isolation effect.

SUMMARY OF THE INVENTION

It is therefore an object of the invention to provide a transmit/receive (T/R) switching circuitry for a magnetic resonance (MR) radio frequency (RF) antenna for use in an MR imaging system, wherein the T/R switching circuitry has improved RF isolation properties. In addition, the T/R switching circuitry of the invention may provide more design freedom.

In one aspect of the present invention, the object is achieved by a T/R switching circuitry comprising:
  an RF input transmission line provided for transmitting RF power to the MR RF antenna;
  an RF output transmission line provided for transferring MR signals away from the MR RF antenna, wherein the MR signals are to be received by the MR RF antenna at an MR frequency;
  at least two RF solid state switching members, wherein the RF input transmission line is connected to the MR RF antenna via a first one of the at least two RF solid switching members;
  a bias current generating circuit provided for generating a DC bias current for the at least two RF solid state switching members;
  wherein an RF impedance of the at least two RF solid state switching members is controllable between a substantially electrically non-conducting state and a substantially electrically conducting state by variation of the bias current;

at least a first inductor and at least a first capacitor that are connected via the first one of the at least two RF solid state switching members;

wherein the first one of the at least two RF solid state switching members and one out of the first inductor and the first capacitor are connected in series between the RF input transmission line and the RF output transmission line; and wherein the first inductor and the first capacitor form a parallel resonant circuit with a resonance frequency that is substantially equal to the MR frequency, and that is connected in parallel to the MR RF antenna with regard to the RF input transmission line, when the at least two RF solid state switching members are in the substantially electrically conducting state;

at least a second inductor that is connected in series between the one out of the first inductor and the first capacitor and the RF output transmission line, if the first capacitor is connected in series between the RF input transmission line and the RF output transmission line, or at least a second capacitor that is connected in series between the one out of the first inductor and the first capacitor and the RF output transmission line, if the first inductor is connected in series between the RF input transmission line and the RF output transmission line, wherein the second inductor and the first capacitor or the second capacitor and the first inductor form a series resonant circuit with a resonance frequency that is substantially equal to the MR frequency, and that is connected in series between the first one of the at least two RF solid state switching members and the RF output transmission line; and wherein the second one of the at least two RF solid state switching members is connected to a common node of the inductor and the capacitor of the series resonant circuit.

The phrase "solid state switching member", as used in this application, shall be understood particularly as an electronic switching device based on semiconductor technology. Examples of solid state switching members are PIN diodes or transistors.

The phrase "a frequency is substantially equal to the MR frequency", as used in this application, shall be understood particularly as the frequency to lie within a range symmetric about the MR frequency having a width of preferably ±5%, and, most preferably, of ±2% of the MR frequency.

By control of the switching members via the bias current, consecutive RF transmit periods and RF receive periods can be generated at reduced complexity, size and cost of the T/R switching circuitry while providing high RF isolation between the RF input transmission line and the RF output transmission line and its connected RF components at any time of operation.

In a preferred embodiment of the present invention, the T/R switching circuitry comprises a second series resonant circuit having at least one capacitor and at least one inductor, with a resonance frequency that is substantially equal to the MR frequency; and at least a third RF solid state switching member;

wherein the second series resonant circuit is connected in series between the first series resonant circuit and the RF output transmission line, and wherein the at least third RF solid state switching member is connected to a common node of the inductor and the capacitor of the second series resonant circuit.

By that, a highly improved RF isolation between the RF input transmission line and the RF output transmission line and connected RF components can be achieved.

In a further preferred embodiment of the present invention, at least one of the RF solid state switching members includes a PIN diode. At radio frequencies under consideration (42.6 MHz/Tesla for nuclei hydrogen $^1$H), a PIN diode functions as an electric component whose RF impedance is an inverse function of a forward DC current flowing through it. Therefore, the RF impedance can be readily controlled between a substantially electrically non-conducting state and a substantially electrically conducting state by variation of the bias current, and a cost-effective solution for the RF solid state switching member can be provided. Herein, the phrases "substantially electrically non-conducting state" and "substantially electrically conducting state", as used in this application, shall be understood particularly as a ratio of RF impedances in the two states of larger than 500, preferably larger than 1.000, and, most preferably, larger than 10.000.

It is another object of the invention to provide a magnetic resonance (MR) radio frequency (RF) antenna unit for use in an MR imaging system, comprising:

at least one MR RF antenna; and at least one of the disclosed embodiments of a transmit/receive (T/R) switching circuitry or combinations thereof that is connected to the at least one MR RF antenna.

By that, the MR imaging system can be furnished with a highly compact MR RF antenna unit with excellent RF isolation properties between the RF input transmission line and the RF output transmission line.

It is yet another object of the invention to provide an array of magnetic resonance (MR) radio frequency (RF) antenna units, comprising a plurality of MR RF antennae, wherein each of the MR RF antennae is designed as a local RF coil;

a plurality of disclosed embodiments of a transmit/receive (T/R) switching circuitry or combinations thereof;

wherein at least one T/R switching circuitry of the plurality of T/R switching circuitries is connected to each MR RF antenna of the plurality of MR RF antennae.

The phrase "local RF coil", as used in this application, shall be understood particularly as an RF antenna that is provided to be arranged in a distance to the subject of interest that is smaller than a largest linear dimension of the RF coil. Local RF coils are usually arranged close to a portion of the subject of interest and may even be in contact to the subject of interest, and are known to have a high signal-to-noise ratio. Local RF coils may have a circular design or a quadratic design being arranged in a plane surface, but may as well have a polygon design.

Thus, a highly compact array of local RF coils can be provided that can cover a large portion of the subject of interest, having a sufficiently large RF isolation between the RF input transmission line and the RF output transmission line.

In yet a further preferred embodiment, each T/R switching circuitry of the plurality of T/R switching circuitries is arranged in close proximity to the MR RF antenna that it is connected to. The phrase "in close proximity", as used in this application, shall be understood particularly as a region in space with a closest distance to the MR RF antenna that is smaller than a largest extension of the MR RF antenna in a direction lying in the plane surface, preferably less than 50% of the largest extension, and, most preferably, less than 30% of the largest extension of the MR RF antenna in the direction lying in the plane surface. By that, an array of local RF coils with a small physical size per coil can be provided having a sufficiently large RF isolation between the RF input transmission line and the RF output transmission line.

In another aspect of the present invention, a method for generating consecutive RF transmit periods and RF receive periods of an MR imaging system is provided; the MR imaging system comprising:

- at least one of the disclosed embodiments of T/R switching circuitries or a combination thereof;
- at least one MR RF antenna provided to transmit RF electromagnetic fields during transmit periods and to receive RF electromagnetic fields during RF receive periods; the method comprising steps of
- controlling the bias current to exceed a pre-determined first threshold current to transfer the RF solid state switching members from the substantially electrically non-conducting state to the substantially electrically conducting state to generate an RF transmit period; and
- controlling the bias current to fall below a pre-determined second threshold current to transfer the RF solid state switching members from the substantially electrically conducting state to the substantially electrically non-conducting state to generate an RF receive period.

The method can allow for easy, part-saving and cost-effective generation of consecutive RF transmit periods and RF receive periods of the MR imaging system.

It is another aspect of the present invention to provide a software module for controlling an execution of steps of an embodiment of the disclosed methods for generating consecutive RF transmit periods and RF receive periods, wherein the steps are converted into a program code that is implementable in a memory element of a control unit of an MR imaging system and that is executable by a processing unit of the control unit. By that, a flexible and portable solution can be provided may readily be implemented into any MR imaging system.

It is yet another aspect of the present invention to provide a switching control unit for use in an MR imaging system to the same end, the MR imaging system having at least one MR RF antenna, and the switching control unit being provided for generating consecutive RF transmit periods and RF receive periods of the MR imaging system, comprising:

- at least one of the disclosed embodiments of a T/R switching circuitry or a combination thereof;
- an embodiment of the disclosed software module or a variation thereof;
- a processing unit;
- at least one memory element;
- wherein the software module is implementable in the memory element and executable by the processing unit. Generally, the switching control unit may be integrated in another MR imaging control unit.

It is another object of the invention to provide an MR imaging system, comprising

- at least one MR RF antenna; and
- at least one embodiment of the disclosed switching control units or a variation thereof.

Thus, an MR imaging system with consecutive RF transmit periods and RF receive periods can be provided having improved properties regarding complexity of parts and operation, size of MR RF antennae, MR signal quality and inherent protection of sensitive electronic equipment.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

FIGS. 1a to 1d illustrate prior art transmit/receive switches which have been depicted in the introductory section already.

Figure 1A:
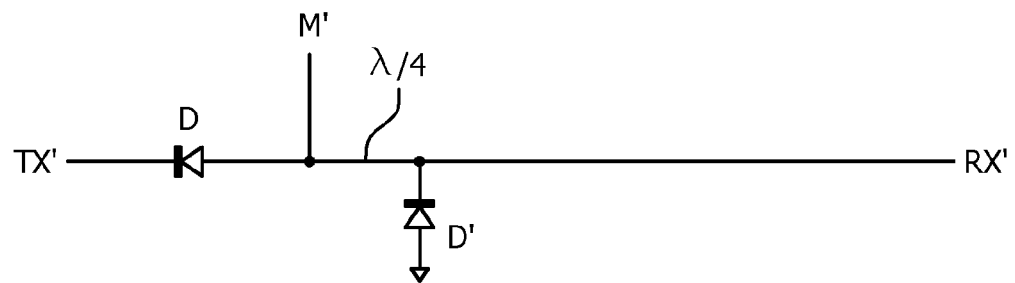
FIG. 1a shows a prior art transmit/receive (T/R) switch employing a quarter-wave transmission line.
Figure 1B:
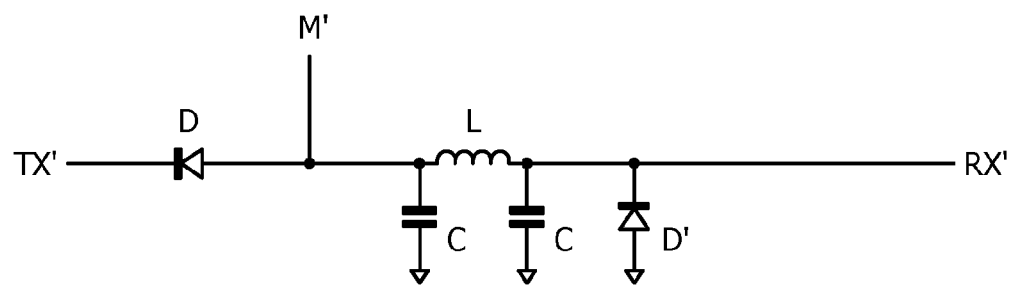
FIG. 1b shows an equivalent lumped-element circuit of the prior art transmit/receive (T/R) switch pursuant to FIG. 1(a)
Figure 1C:
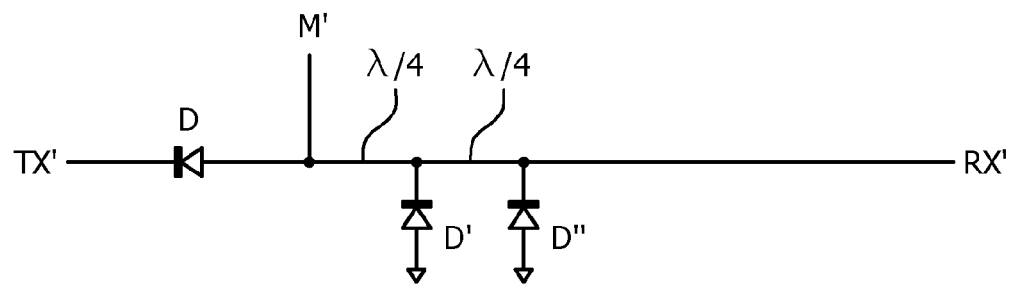
FIG. 1c illustrates a two-stage prior art transmit/receive (T/R) switch employing two quarter-wave transmission lines.
Figure 1D:
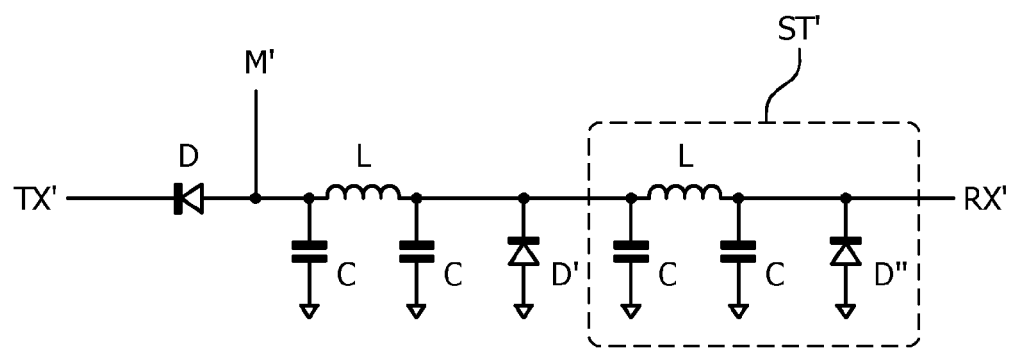
FIG. 1d illustrates an equivalent lumped-element circuit of the two-stage prior art transmit/receive (T/R) switch pursuant to FIG. 1(c)
Figure 2:
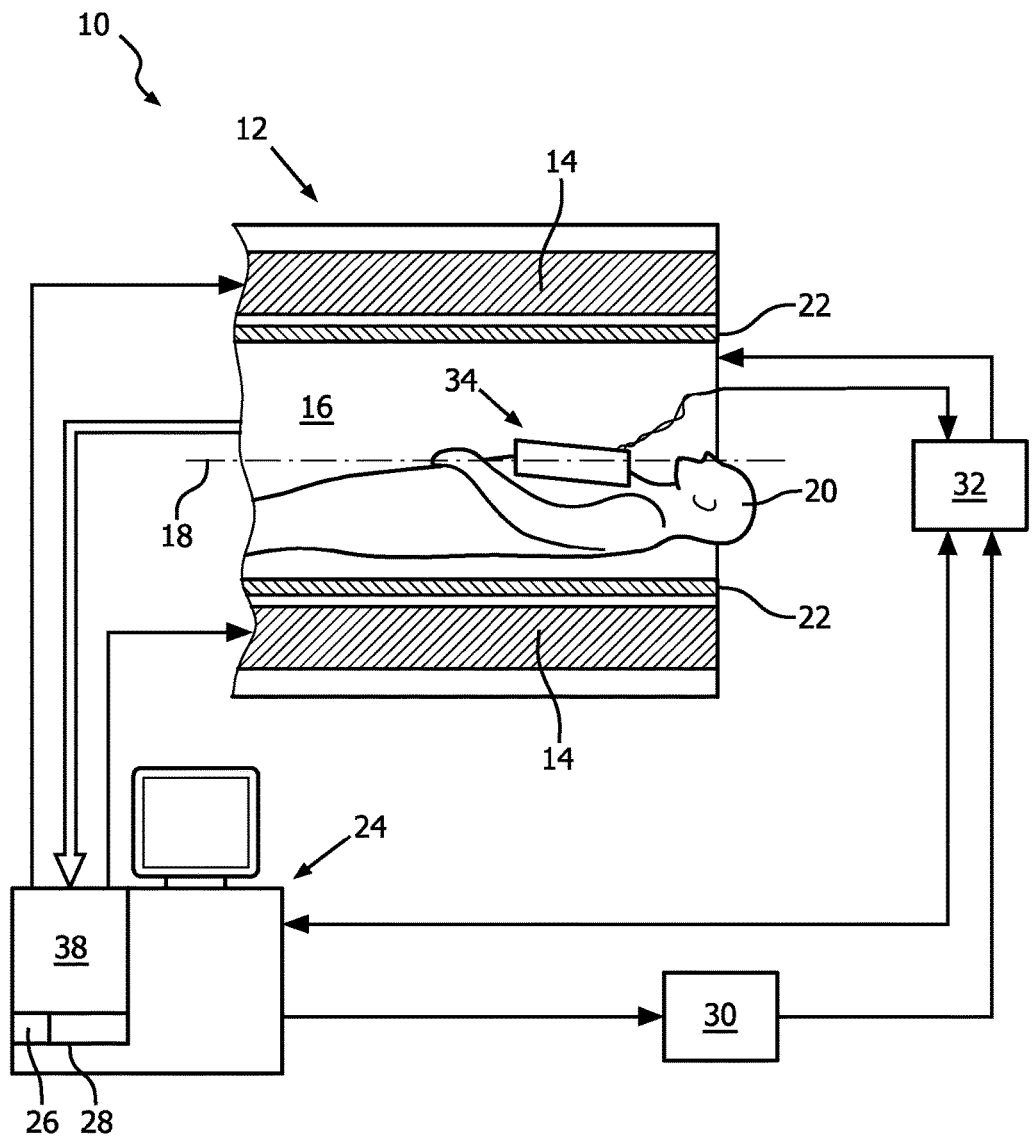
FIG. 2 is a schematic partial view of an embodiment of an MR imaging system in accordance with the invention.

FIG. 2 shows a schematic illustration of a part of an embodiment of a magnetic resonance (MR) imaging system 10 in accordance with the invention, comprising an MR scanner 12. The MR scanner 12 includes a main magnet 14 provided for generating a substantially static magnetic field. The main magnet 14 has a central bore that defines an examination space 16 around a center axis 18 for a subject of interest 20, usually a patient, to position within. It should be noted that, in principle, the invention is also applicable to any other type of MR imaging system providing an examination region within a static magnetic field. Further, the MR imaging system 10 comprises a magnetic gradient coil system 22 provided for generating gradient magnetic fields superimposed to the static magnetic field. The magnetic gradient coil system 22 is concentrically arranged within the bore of the main magnet 14, as is well known in the art.

Further, the MR imaging system 10 includes an array 34 of magnetic resonance (MR) radio frequency (RF) antenna units 36 (FIG. 5) that is provided for applying an RF magnetic field to excite nuclei within the subject of interest 20 during RF transmit periods of the MR imaging system 10. The array 34 of MR RF antenna units 36 is also provided to receive MR signals from the excited nuclei during RF receive periods, as will be described in the following. In a state of operation of the MR imaging system 10, RF transmit periods and RF receive periods are taking place in a consecutive manner.

Moreover, the MR imaging system 10 comprises an MR image reconstruction unit 38 provided for reconstructing MR images from acquired MR signals, and an MR imaging system control unit 24 with a monitor unit provided to control functions of the MR scanner 12, as is commonly known in the art. Control lines are installed between the MR imaging system control unit 24 and an RF transmitter unit 30 that is provided to feed RF power of an MR radio frequency to the array 34 of MR RF antenna units 36 via an RF switching control unit 32 during the RF transmit periods. The RF switching control unit 32 in turn is also controlled by the MR imaging system control unit 24, and another control line is installed between the MR imaging system control unit 24 and the RF switching control unit 32 to serve that purpose. During RF receive periods the RF switching control unit 32 directs the acquired MR signals from the array 34 of MR RF antenna units 36 to the MR image reconstruction unit 38 via a pre-amplifier unit (not shown).

Figure 5:
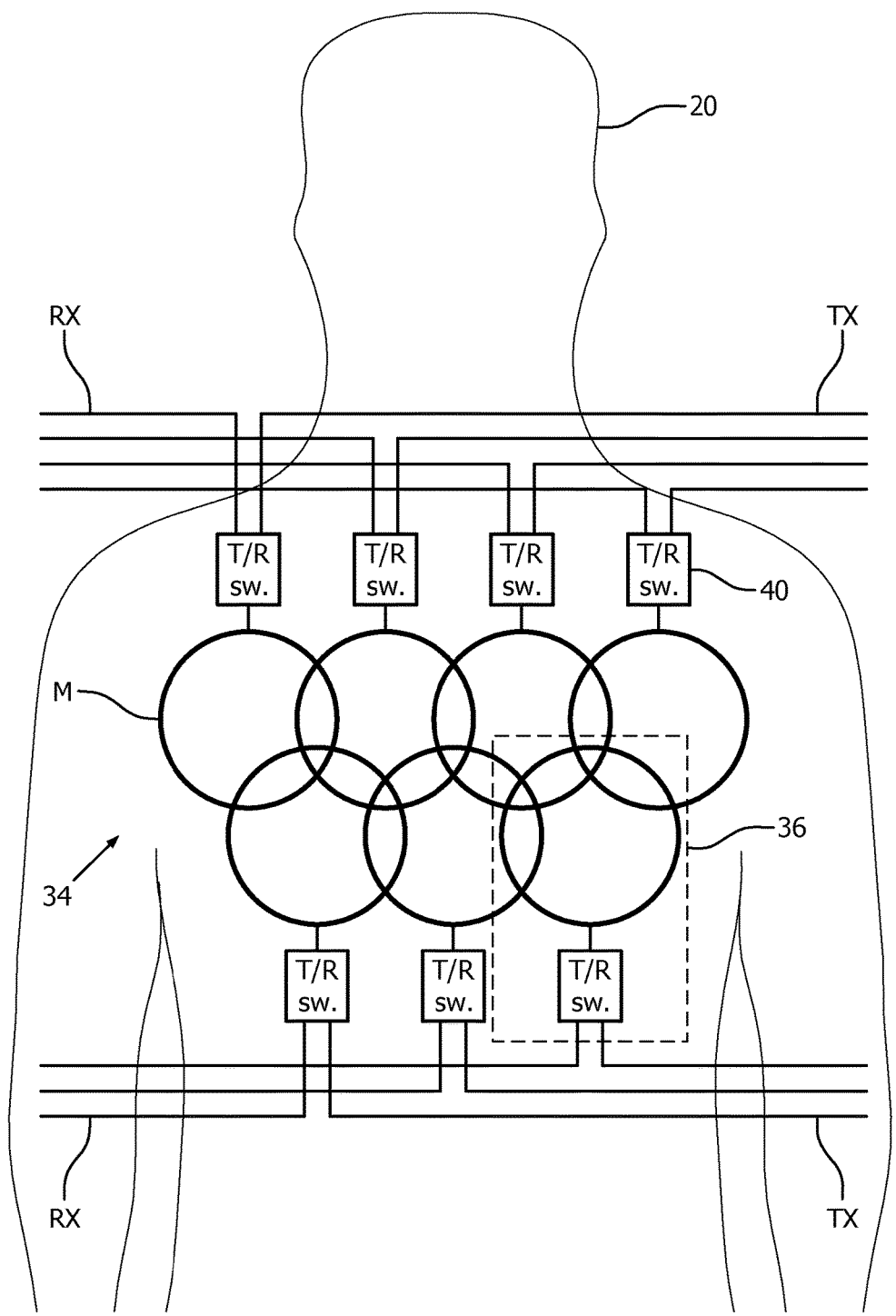
FIG. 5 shows a schematic detailed view of an MR RF antennae array of the MR imaging system pursuant to FIG. 2.

The array 34 of MR RF antenna units 36 comprises a plurality of seven MR RF antennae M, as shown in FIG. 5, wherein each of the MR RF antennae M is designed as a local RF coil of circular shape, and a plurality of seven transmit/receive (T/R) switching circuitries 40. The array 34 of MR RF antenna units 36 is arranged such that all local RF coils substantially lie within a plane that is aligned parallel to the view plane of FIG. 5.

Each of the MR RF antenna units 36 comprises one MR RF antenna M of the plurality of MR RF antennae and one T/R switching circuitry 40 that is connected to the MR RF antenna M. The MR RF antenna M of each one of the MR RF antenna units 36 projects into and partially overlaps with each MR RF antenna M of its adjacent MR RF antenna units 36, the number of which varies from two to four. Each T/R switching circuitry 40 of the plurality of T/R switching circuitries is arranged in close proximity to the MR RF antenna M that it is connected to, as a closest distance between each one of the T/R switching circuitries 40 to the MR RF antenna M it is connected to is less than 30% of the largest extension of the MR RF antenna M in the direction parallel to the plane.

Figure 3:
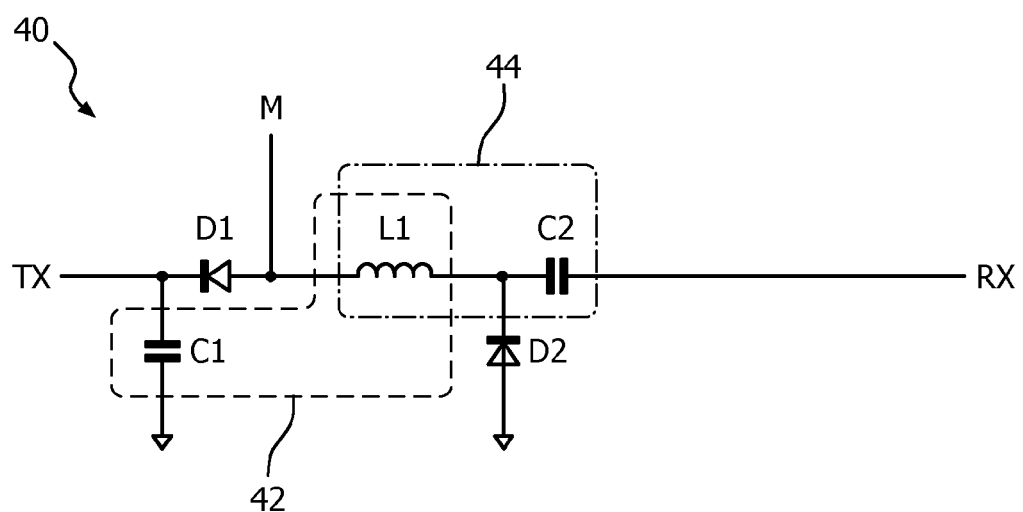
FIG. 3 illustrates an embodiment of a transmit/receive (T/R) switching circuitry in accordance with the invention.

FIG. 3 illustrates an embodiment of a transmit/receive (T/R) switching circuitry 40 in accordance with the invention, for one of the MR RF antennae M of the plurality of MR RF antennae pursuant to FIG. 5, and for use in the MR imaging system 10 pursuant to FIG. 2.

The T/R switching circuitry 40 comprises an RF input transmission line TX provided for transmitting RF power at a resonance frequency to the MR RF antenna M for resonant excitation of nuclei in the subject of interest 20 during periods of transmitting RF power. Further, the T/R switching circuitry 40 comprises an RF output transmission line RX provided for transferring MR signals emitted by the excited nuclei and received by the MR RF antenna M away from the MR RF antenna M to the MR image reconstruction unit 38 during periods of receiving MR signals.

Moreover, the T/R switching circuitry 40 comprises a first RF solid state switching member D1 and a second RF solid state switching member D2, both of which include a PIN diode. An RF impedance of the two RF solid state switching members D1, D2 is controllable between a substantially electrically non-conducting state with an impedance of more than 10 kΩ and a substantially electrically conducting state with an impedance of less than 0.5Ω by variation of a DC bias current. The DC bias current is provided by a bias current generating circuit (not shown for clarity reasons) that is integrated in the RF switching control unit 32, to flow through the two RF solid state switching members D1, D2. Preferably, the two RF solid state switching members D1, D2 are connected in series with regard to the bias current generating circuit in order to save parts. However, the bias current generating circuit may also comprise independent circuits for generating individual DC bias currents for each of the two RF solid state switching members D1, D2.

The DC bias generating circuit has to be realized with serial inductors blocking out any RF current from feeding lines. Additionally, large DC-blocking capacitors might be implemented in RF connections in order to avoid any DC currents flowing into RF connecting ports. Furthermore, any stray/remaining capacities at the PIN diodes in the substantially non-conducting state can be compensated for by parallel inductors. These techniques are common and known to those skilled in the art.

As shown in FIG. 3, the RF input transmission line TX is connected to the MR RF antenna M via the first RF solid state switching member D1. The T/R switching circuitry 40 further includes a first inductor L1 and a first capacitor C1 that are connected via the first RF solid state switching member D1, wherein the first RF solid state switching member D1 and the first inductor L1 are connected in series between the RF input transmission line TX and the RF output transmission line RX.

The first inductor L1 and the first capacitor C1 form a parallel resonant circuit 42 with a resonance frequency that is substantially equal to the MR frequency. The parallel resonant circuit 42 is connected in parallel to the MR RF antenna M with regard to the RF input transmission line TX, when the two RF solid state switching members D1, D2 are in the substantially electrically conducting state. As is well known, the parallel resonant circuit 42 has maximum RF impedance at the resonance frequency.

Furthermore, the T/R switching circuitry 40 comprises a second capacitor C2 that is connected in series between the first inductor L1 and the RF output transmission line RX. The second capacitor C2 and the first inductor L1 form a first series resonant circuit 44 with a resonance frequency that is substantially equal to the MR frequency. The series resonant circuit 44 is connected in series between the first RF solid state switching member D1 and the RF output transmission line RX. As is well known, the series resonant circuit 44 has minimum RF impedance at the resonance frequency.

As illustrated in FIG. 3, the second RF solid state switching member D2 is connected to a common node of the first inductor L1 and the second capacitor C2 of the series resonant circuit 44.

Function of the T/R Switching Circuitry

An RF transmit period of the MR imaging system 10 can be generated employing the T/R switching circuitry 40 pursuant to FIG. 3 as follows.

The MR imaging system control unit 24 controls the RF switching control unit 32 to let the DC bias current exceed a pre-determined first threshold current to transfer the RF solid state switching members D1, D2 from the substantially electrically non-conducting state to the substantially electrically conducting state. Therefore, the RF input transmission line TX is directly connected to the MR RF antenna M which is connected in parallel to the parallel resonant circuit 42. The parallel resonant circuit 42 has maximum RF impedance at the resonance frequency, thus blocking the RF power coming from the RF input transmission line TX which is thus directed to the MR RF antenna M. With regard to RF isolation between the RF input transmission line TX and the RF output transmission line RX, this is determined by the voltage divider formed by the impedance of the second RF solid state switching member D2 in the substantially electrically conducting state and the first inductor L1 of the series resonant circuit 44 connecting the second RF solid state switching member D2 to the MR RF antenna M.

An RF receive period of the MR imaging system 10 can be generated employing the T/R switching circuitry 40 pursuant to FIG. 3 as follows.

The MR imaging system control unit 24 controls the RF switching control unit 32 to let the DC bias current fall below a pre-determined second threshold current to transfer the RF solid state switching members D1, D2 from the substantially electrically conducting state to the substantially electrically non-conducting state. Therefore, the first RF switching member D1 is blocking the RF power coming from the RF input transmission line TX. The series resonance circuit 44 has minimum RF impedance at the resonance frequency. So, MR signals that are received by the MR RF antenna M are let pass to the RF output transmission line RX.

The pre-determined first threshold current and the pre-determined second threshold current may be distinct, but they may also be identical.

In the design of the embodiment of the T/R switching circuitry 40, values of capacitors C1, C2 and inductors L1 are not fixed individually as in the prior art design. Instead, there exists only the resonance condition as a design constraint. This allows for an additional degree of freedom, which can not only be used to improve RF isolation, but may also ease manufacturing, since the T/R switching circuitry 40 does not require a specific set of component values.

It should be noted at this point that another embodiment of the T/R switching circuitry 40 can be realized by exchanging the positions of capacitors and inductors in the T/R switching circuitry 40 pursuant to FIG. 3, i.e. by replacing capacitors by inductors and vice versa. This is obvious to the one skilled in the art, and is reflected in the wording of claim 1.

In order to enable the MR imaging system control unit 24 to control the RF switching control unit 32 and by that, the DC bias current, the MR imaging system control unit 24 is furnished with a software module 26 for controlling an execution of the control steps, wherein the control steps are converted into a program code that is implementable in a memory element 28 of the MR imaging system control unit 24, and that is executable by a processing unit of the MR imaging system control unit 24.

Figure 4:
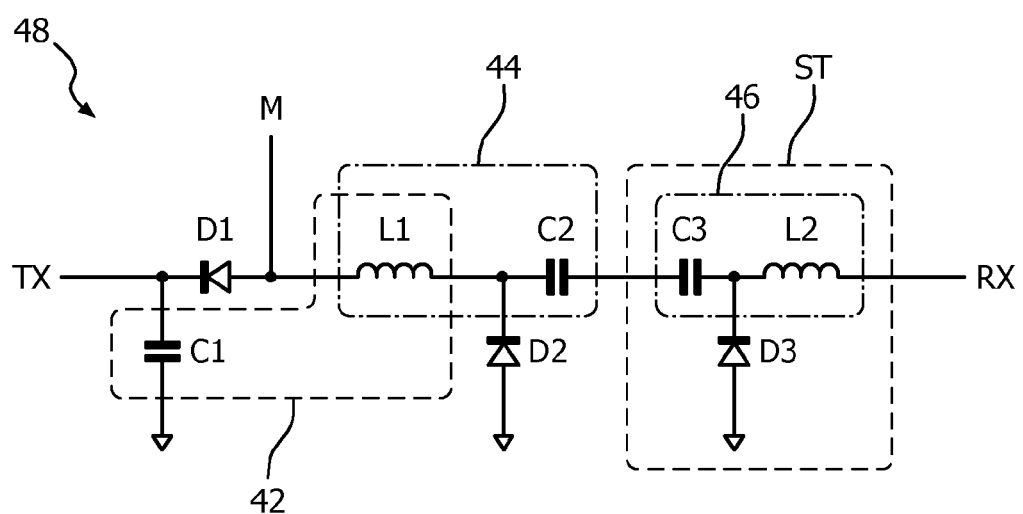
FIG. 4 illustrates another embodiment of a transmit/receive (T/R) switching circuitry in accordance with the invention.

FIG. 4 illustrates another embodiment of a T/R switching circuitry 48 in accordance with the invention. The embodiment pursuant to FIG. 4 comprises all of the components of the embodiment pursuant to FIG. 3, and an additional second stage ST. The second stage ST comprises a second series resonant circuit 46 having a third capacitor C3 and a second inductor L2, with a resonance frequency that is substantially equal to the MR frequency, and a third RF solid state switching member D3 that includes a PIN diode. The second series resonant circuit 46 is connected in series between the first series resonant circuit 44 and the RF output transmission line RX. The third RF solid state switching member D3 is connected to a common node of the second inductor L2 and the third capacitor C3 of the second series resonant circuit 46, and is controlled by a DC bias current in a way that is substantially synchronous to the first RF solid state switching member D1 and the second RF solid state switching member D2. The third RF solid state switching member D3 is controllable between a substantially electrically non-conducting state and a substantially electrically conducting state by variation of a DC bias current in the same way as the other RF solid state switching members D1, D2.

In an RF transmit period of the MR imaging system 10, when the three RF solid state switching members D1, D2, D3 are in the substantially electrically conducting state, the RF input transmission line TX is directly connected to the MR RF antenna M, which is connected in parallel to the parallel resonant circuit 42. As explained before, the parallel resonant circuit 42 has maximum RF impedance at the resonance frequency and blocks the RF power coming from the RF input transmission line TX. In addition, RF isolation between the RF input transmission line TX and the RF output transmission line RX is enhanced by the second voltage divider formed by the impedance of the third RF solid state switching member D3 in the substantially electrically conducting state and the impedance of the third capacitor C3 of the second resonance circuit 46 connecting the third RF solid state switching member D3 to the first series resonance circuit 44.

The performance of the proposed circuit has been analyzed employing analog circuit simulator software. The PIN diodes were modeled by their RF impedances in the substantially non-conducting state and substantially conducting state, respectively. Series resistances of the inductors in the circuits were derived from measurements on Coilcraft coils, i.e. the losses of these components were accurately modeled in accordance with a physical realization. The RF isolation and RF attenuation has been calculated by determining the RF power at a 50Ω load in relation to the RF input power of a 50Ω source. The results of the simulations are summarized in Table 1 and demonstrate that the RF isolation that is achievable with the T/R switching circuitries in accordance with the invention are superior to the ones of the prior art. The input impedances were close to 50Ω at the MR frequency of 128 MHz in all cases.

The proposed circuit can be realized in different ways even for a single stage design, i.e. with different inductor values. In this way also different performances can be achieved, as indicated in Table 1. As a consequence, the RF isolation can be increased compared to the standard design, so that a single stage can be safely employed for local transmit/receive coils. This significantly reduces complexity and size of the T/R switching circuitry 40. Furthermore, fewer PIN diodes are employed, and, in turn, less bias current is required.

TABLE 1

| Configuration | L [nH] | L [mΩ] | C [pF] | RF Isolation [dB] | Attenuation TX [dB] | Attenuation RX [dB] | I_D2 [mA] (1 V @ TX) |
|---|---|---|---|---|---|---|---|
| Prior art, single stage | 62 | 415 | 24.9 | −48.0 | −0.07 | −0.11 | 9.9 |
| Prior art, two stages | 62 | 415 | 24.9 | −96.0 | −0.07 | −0.21 | |
| New, single stage | 62 | 415 | 24.9 | −51.1 | −0.02 | −0.10 | 9.9 |
| New, single stage | 100 | 686 | 15.46 | −57.7 | −0.02 | −0.16 | 6.2 |
| New, single stage | 124 | 857 | 12.47 | −61.0 | −0.02 | −0.20 | 5.0 |
| New, two stages | 62 | 415 | 24.9 | −105.1 | −0.09 | −0.19 | |
| New, two stages | 100 | 686 | 15.4 | −115.9 | −0.05 | −0.29 | |
| New, two stages | 34 | 216 | 45.5 | −92.8 | −0.19 | −0.11 | |

Additionally, it can be observed that an RF current through the PIN diode D2 at the common node of the first inductor L1 and the second capacitor C2 of the first series resonant circuit 44 is reduced in the proposed embodiment, which lowers the power requirements for this PIN diode.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST

| | |
|---|---|
| 10 | MR imaging system |
| 12 | MR scanner |
| 14 | main magnet |
| 16 | examination space |
| 18 | center axis |
| 20 | subject of interest |
| 22 | magnetic gradient coil system |
| 24 | MR imaging system control unit |
| 26 | software module |
| 28 | memory element |
| 30 | RF transmitter unit |
| 32 | RF switching control unit |
| 34 | MR RF antennae array |
| 36 | MR RF antenna unit |
| 38 | MR image reconstruction unit |
| 40 | T/R switching circuitry |
| 42 | parallel resonant circuit |
| 44 | first series resonant circuit |
| 46 | second series resonant circuit |
| 48 | T/R switching circuitry |
| C1 | first capacitor |
| C2 | second capacitor |
| C3 | third capacitor |
| D1 | first RF solid state switching member |
| D2 | second RF solid state switching member |
| D3 | third RF solid state switching member |
| L1 | first inductor |
| L2 | second inductor |
| M | MR RF antenna |
| RX | RF output transmission line |
| ST | second stage (prior art) |
| TX | RF input transmission line |

The invention claimed is:

1. A T/R switching circuitry for a MR RF antenna for use in an MR imaging system, the T/R switching circuitry comprising:
    an RF input transmission line provided for transmitting RF power to the MR RF antenna (M);
    an RF output transmission line provided for transferring MR signals away from the MR RF antenna, wherein the MR signals are to be received by the MR RF antenna at an MR frequency;
    at least two RF solid state switching members, wherein the RF input transmission line is connected to the MR RF antenna via a first one of the at least two RF solid switching members;
    a bias current generating circuit provided for generating DC bias current for the at least two RF solid state switching members;
    wherein an RF impedance of the at least two RF solid state switching members is controllable between a substantially electrically non-conducting state and a substantially electrically conducting state by variation of the bias current;
    at least a first inductor and at least a first capacitor that are connected via the first one of the at least two RF solid state switching members;
    wherein the first one of the at least two RF solid state switching members and one out of the first inductor and the first capacitor are connected in series between the RF input transmission line and the RF output transmission line; and wherein the first inductor and the first capacitor form a parallel resonant circuit with a resonance frequency that is substantially equal to the MR frequency, and that is connected in parallel to the MR RF antenna with regard to the RF input transmission line, when the at least two RF solid state switching members are in the substantially electrically conducting state;
    at least a second inductor that is connected in series between the one out of the first inductor and the first capacitor and the RF output transmission line, if the first capacitor is connected in series between the RF input transmission line and the RF output transmission line, or
    at least a second capacitor that is connected in series between the one out of the first inductor and the first capacitor and the RF output transmission line, if the first inductor is connected in series between the RF input transmission line and the RF output transmission line,
    wherein the second inductor and the first capacitor or the second capacitor and the first inductor form a series resonant circuit with a resonance frequency that is substantially equal to the MR frequency, and that is connected in series between the first one of the at least two RF solid state switching members and the RF output transmission line; and
    wherein the second one of the at least two RF solid state switching members is connected to the common node of the inductor and the capacitor of the series resonant circuit.

2. The T/R switching circuitry as claimed in claim 1, further comprising
    a second series resonant circuit having at least one capacitor and at least one inductor, with a resonance frequency that is substantially equal to the MR frequency; and
    at least a third RF solid state switching member;
    wherein the second series resonant circuit is connected in series between the first series resonant circuit and the RF output transmission line, and
    wherein the at least third RF solid state switching member is connected to the common node of the inductor and the capacitor of the second series resonant circuit.

3. The T/R switching circuitry as claimed in claim 1, wherein at least one of the RF solid state switching members includes a PIN diode.

4. An MR RF antenna unit for use in an MR imaging system, comprising:
    at least one MR RF antenna, and
    at least one T/R switching circuitry as claimed in claim 1 that is connected to the at least one MR RF antenna.

5. An array of MR RF antenna units, comprising
    a plurality of MR RF antennae, wherein each MR antenna of the MR RF antennae is designed as a local RF coil;
    a plurality of T/R switching circuitries as claimed in claim 1;

wherein at least one T/R switching circuitry of the plurality of T/R switching circuitries is connected to each MR RF antenna of the plurality of MR RF antennae.

6. The array of MR RF antenna units as claimed in claim 5, wherein each T/R switching circuitry of the plurality of T/R switching circuitries is arranged in close proximity to the MR RF antenna that it is connected to.

7. Method for generating consecutive RF transmit periods and RF receive periods of an MR imaging system; the MR imaging system comprising:
   at least one T/R switching circuitry as claimed in claim 1;
   at least one MR RF antenna provided to transmit RF electromagnetic fields during transmit periods and to receive RF electromagnetic fields during RF receive periods;
   the method comprising steps of
   controlling the bias current to exceed a pre-determined first threshold current to transfer the RF solid state switching members from the substantially electrically non-conducting state to the substantially electrically conducting state to generate an RF transmit period; and
   controlling the bias current to fall below the pre-determined second threshold current to transfer the RF solid state switching members from the substantially electrically conducting state to the substantially electrically non-conducting state to generate an RF receive period.

8. A software module for controlling an execution of the steps of the method as claimed in claim 7, wherein the steps are converted into a program code that is implementable in a memory element of a control unit of an MR imaging system and that is executable by a processing unit of the control unit.

9. A switching control unit for use in an MR imaging system having at least one MR RF antenna, the switching control unit being provided for generating consecutive RF transmit periods and RF receive periods of the MR imaging system, and comprising:
   at least one T/R switching circuitry as claimed in claim 1;
   the software module;
   a processing unit;
   at least one memory element;
   wherein the software module is implementable in the memory element and executable by the processing unit.

10. An MR imaging system, comprising
   at least one MR RF antenna; and
   at least one switching control unit as claimed in claim 9.

* * * * *